(12) United States Patent
Giraudin et al.

(10) Patent No.: US 7,479,424 B2
(45) Date of Patent: Jan. 20, 2009

(54) METHOD FOR FABRICATING AN INTEGRATED CIRCUIT COMPRISING A THREE-DIMENSIONAL CAPACITOR

(75) Inventors: Jean-Christophe Giraudin, Bernin (FR); Sébastien Cremer, Sassenage (FR); Philippe Delpech, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 274 days.

(21) Appl. No.: 11/405,680

(22) Filed: Apr. 17, 2006

(65) Prior Publication Data

US 2006/0234464 A1 Oct. 19, 2006

(30) Foreign Application Priority Data

Apr. 19, 2005 (FR) .................................. 05 03894

(51) Int. Cl.
*H01L 21/8242* (2006.01)
*H01L 29/76* (2006.01)

(52) U.S. Cl. ....................... 438/243; 257/301
(58) Field of Classification Search ................ 438/238, 438/243, 381, 386; 257/301, 309
See application file for complete search history.

(56) References Cited

U.S. PATENT DOCUMENTS

| | | | |
|---|---|---|---|
| 5,604,696 | A | 2/1997 | Takaishi et al. |
| 5,851,870 | A | 12/1998 | Alugbin et al. |
| 6,008,083 | A | 12/1999 | Brabazon et al. |
| 6,180,976 | B1 | 1/2001 | Roy |
| 6,249,014 | B1 | 6/2001 | Bailey |
| 6,251,740 | B1 | 6/2001 | Johnson et al. |
| 6,344,964 | B1 | 2/2002 | Adler |
| 6,399,399 | B2 | 6/2002 | Yamamoto |
| 6,441,419 | B1 | 8/2002 | Johnson et al. |
| 6,452,779 | B1 | 9/2002 | Adler et al. |
| 6,611,014 | B1 | 8/2003 | Kanaya et al. |
| 6,713,840 | B1 | 3/2004 | Lee et al. |
| 6,765,255 | B2 | 7/2004 | Jin et al. |
| 6,876,027 | B2 | 4/2005 | Lien et al. |
| 7,253,075 | B2 | 8/2007 | Hieda |
| 2002/0094656 | A1 | 7/2002 | Armacost et al. |
| 2002/0163029 | A1 | 11/2002 | Dirnecker et al. |
| 2003/0222301 | A1 | 12/2003 | Igarashi |
| 2004/0053427 | A1 | 3/2004 | Lee |
| 2004/0169211 | A1 | 9/2004 | Zhuang et al. |
| 2004/0201057 | A1 | 10/2004 | Lien et al. |
| 2005/0064718 | A1 | 3/2005 | Yin et al. |
| 2005/0116276 | A1 | 6/2005 | Gau |

OTHER PUBLICATIONS

Preliminary French Search Report, FR 05 03894, dated Dec. 2, 2005.

*Primary Examiner*—Calvin Lee
(74) *Attorney, Agent, or Firm*—Gardere Wynne Sewell LLP

(57) ABSTRACT

A capacitor fabricated, within an integrated circuit, has at least two capacitive trenches extending within a dielectric material. A metal layer is produced which is embedded in the dielectric material. To form the capacitor, the dielectric material is etched, with etching stopped at the metal layer so as to form the trenches. A layer of conductive material forming the lower electrode of the capacitor is then deposited at least on the sidewalls of the trenches and in contact with the metal layer. A dielectric layer is then deposited within the trenches. A layer of conductive material forming the upper electrode of the capacitor is then deposited within the trenches.

9 Claims, 9 Drawing Sheets

METHOD FOR FABRICATING AN INTEGRATED CIRCUIT COMPRISING A THREE-DIMENSIONAL CAPACITOR

PRIORITY CLAIM

The present application claims priority from French Application for Patent No. 05 03894 filed Apr. 19, 2005, the disclosure of which is hereby incorporated by reference.

BACKGROUND OF THE INVENTION

1. Technical Field of the Invention

The present invention relates to integrated circuits and, more particularly, to integrated circuits comprising at least one three-dimensional capacitor.

2. Description of Related Art

It is known to produce three-dimensional capacitors using an aluminum technology (reactive ion etching, RIE) or copper technology (Damascene).

The three-dimensional capacitor is conventionally obtained by depositing a capacitive metal-insulator-metal (MIM) stack in which the lower layer is a conductive material, for example TiN. The insulator is a dielectric material of any permittivity (low, medium or high) and the upper electrode is a conductive material, for example TiN, in trenches which are obtained after etching the intermetallic insulating or dielectric material. Such capacitive trenches have high access resistances, however, particularly at the external electrode which is referred to as the lower electrode. The capacitive value of the capacitor furthermore depends on the depth of the trenches. It moreover proves difficult to ensure good etching reproducibility from one batch of wafers to another, which results in a dispersion of the capacitive values of theoretically identical capacitors.

SUMMARY OF THE INVENTION

Embodiments of the present invention provide a solution to these problems, in particular by forming a metal layer which comes in contact with the bottom of the trenches and is both used as a stop layer for etching the trenches and partially short circuits the lower electrode of the capacitor. The etching height of the trenches is thus controlled from one batch to another, and the access resistance of the capacitor is reduced.

One aspect of the invention also relates to a method for fabricating a capacitor, having at least two capacitive trenches extending within a dielectric material, within an integrated circuit. This method comprises producing a metal layer embedded in the dielectric material, etching the dielectric material, stopping on the metal layer, so as to form the trenches, and then depositing a layer of conductive material forming the lower electrode of the capacitor, at least on the sidewalls of the trenches and in contact with the metal layer.

According to one implementation, the method furthermore comprises the formation of a contact terminal bearing on a part of the metal layer within the dielectric material.

According to another implementation in which the capacitor extends over at least two interconnection levels of the integrated circuit and the embedded metal layer forms part of the metallization level of a lower interconnection level, the method furthermore comprises the formation of a contact terminal bearing directly on the lower electrode, to an upper interconnection level lying above the lower interconnection level, within the dielectric material.

The invention also relates to an integrated circuit comprising at least one capacitor extending within a dielectric material, comprising a metal layer embedded in the dielectric material, at least two capacitive trenches whose bottoms bear on the metal layer and a layer of conductive material forming the lower electrode of the capacitor, which lies at least on the sidewalls of the trenches and in contact with the metal layer.

According to one embodiment, the integrated circuit comprises a contact terminal bearing on a part of the metal layer within the dielectric material.

According to another embodiment, the integrated circuit comprises the capacitor extending over at least two interconnection levels of the integrated circuit, the embedded metal layer forming part of the metallization level of a lower interconnection level. The integrated circuit furthermore comprises a contact terminal bearing directly on the lower electrode at an upper interconnection level lying above the lower interconnection level and positioned within the dielectric material.

According to another embodiment, an integrated circuit comprises a buried metallization layer and dielectric material overlying the buried metallization layer. At least two trenches are formed in the dielectric material extending down to expose the buried metallization layer. A first conductive material layer forming a lower electrode of a capacitor is deposited on the sides of the at least two trenches and the exposed buried metallization layer. A dielectric layer covering the first conductive material layer is deposited within at least the at least two trenches. A second conductive material layer forming an upper electrode of the capacitor is deposited covering the dielectric layer within at least the at least two trenches. In an implementation, a contact terminal is directed connected to the lower electrode of the capacitor at an upper interconnection level of the integrated circuit.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
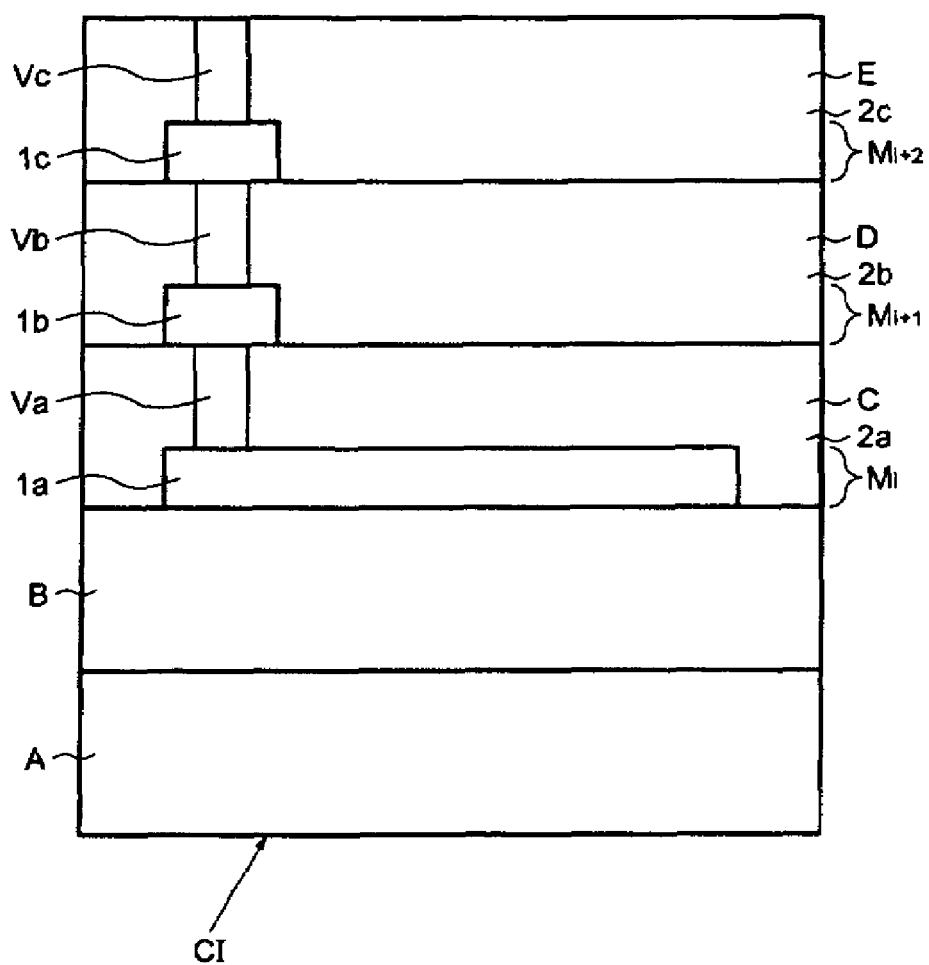
FIGS. 1 to 8 schematically illustrate the main steps of one implementation of a method for fabricating a three-dimensional capacitor according to the invention.

FIG. 1 represents an integrated circuit CI comprising a silicon substrate A on which a dielectric layer B has been deposited. A plurality of interconnection levels C, D and E rest on the dielectric layer B. Each interconnection level includes a metallization level formed by metal tracks and a level of vias, all of this coated in a dielectric material. The production of each interconnection level is conventional and known per se by those skilled in the art. In the example described here, the metallization level $M_i$ of the interconnection level C comprises a metal layer 1a. The layer 1a may be of aluminum or copper. The metallization level $M_{i+1}$ of the interconnection level D comprises an interconnection line, or track 1b. The metallization level $M_{i+2}$ of the interconnection level E comprises an interconnection line, or track 1c. The interconnection lines 1a, 1b, 1c of the various interconnection levels C, D, E are connected to one another by the vias Va, Vb, Vc formed in the dielectric materials 2a, 2b and 2c. The interconnection levels B, C, D and E may incorporate passive components.

Figure 2:
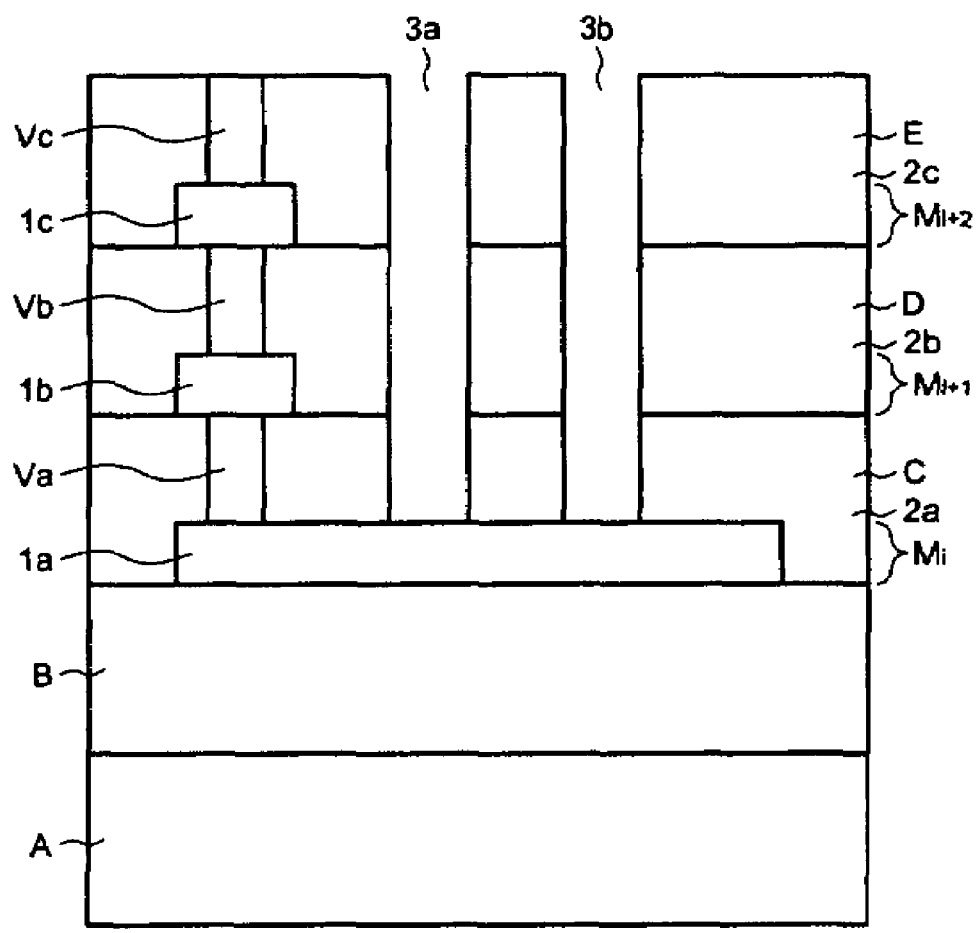

FIG. 2 illustrates the production of two trenches within the integrated circuit CI. The two trenches 3a and 3b have been produced conventionally and in a manner known per se to those skilled in the art by photolithography and then etching within intermetallic dielectrics 2a, 2b and 2c of the levels C, D and E. The etching of these trenches stops on the metal layer 1a.

Figure 3:
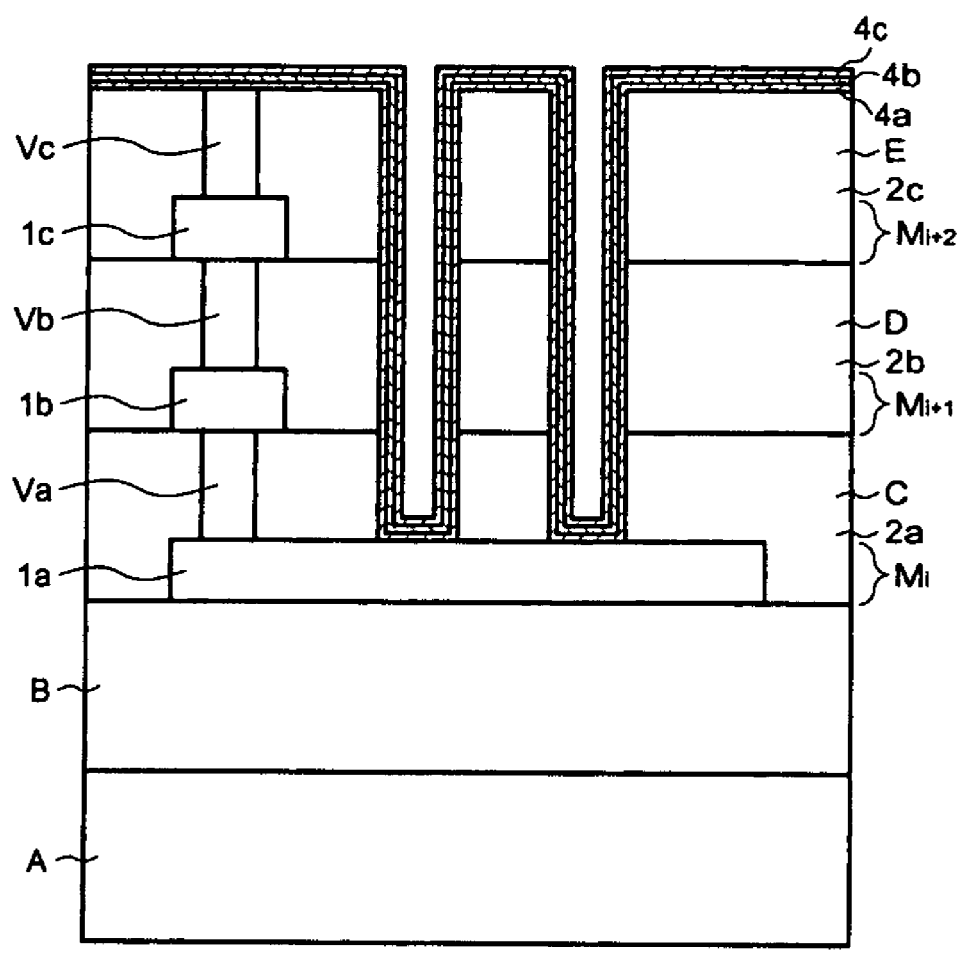

FIG. 3 illustrates the conventional formation, for example by deposition, of a capacitive stack formed by 3 successive layers of metal 4a-insulator 4b-metal 4c. The metal layers forming the electrodes may be of TiN, W, TaN. The insulator layer may consist of $SiO_2$ or a dielectric such as $Ta_2O_5$, $Al_2O_3$, SiN, $HfO_2$, high-K, etc.

This capacitive stack is deposited in particular on the sidewalls of the trenches and their bottom, so that the lower metal layer 4a comes in contact with the metal layer 1a. This metal layer 4a is intended to form the lower electrode of the capacitor.

Figure 4:
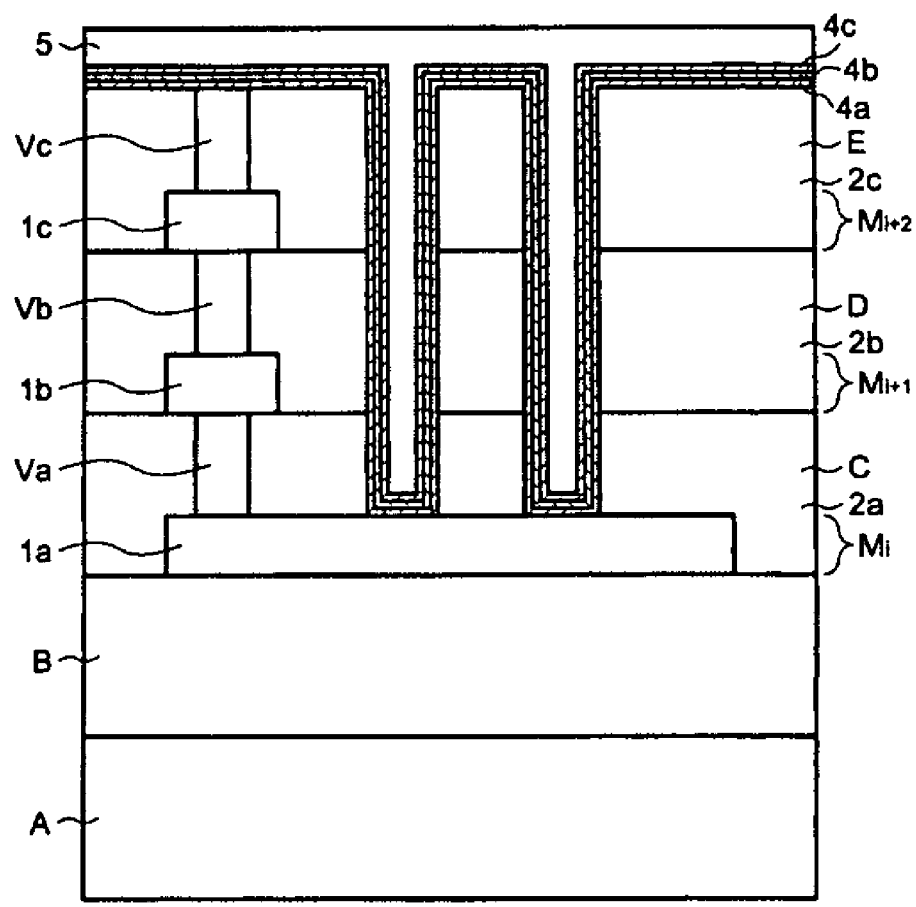

FIG. 4 illustrates the filling of the trenches with a conductive material 5 such as W, TiN, Al, for example by deposition.

This layer of material 5 makes it possible to short-circuit the upper electrode 4c of the capacitor and consequently reduce the access resistance. Furthermore, the thickness of this layer 5 is advantageously selected to be equal to that of the metal tracks of the corresponding metallization level, i.e. the level $M_{i+3}$ lying above the level $M_{i+2}$. Production of the vias is thereby facilitated: the vias Vd1 and Vd2 produced subsequently (see FIG. 8) open simultaneously onto this metal layer 5 (in the case of Vd2) and onto the metal track 9 (in the case of Vd1) which lie at the same level.

Figure 5:
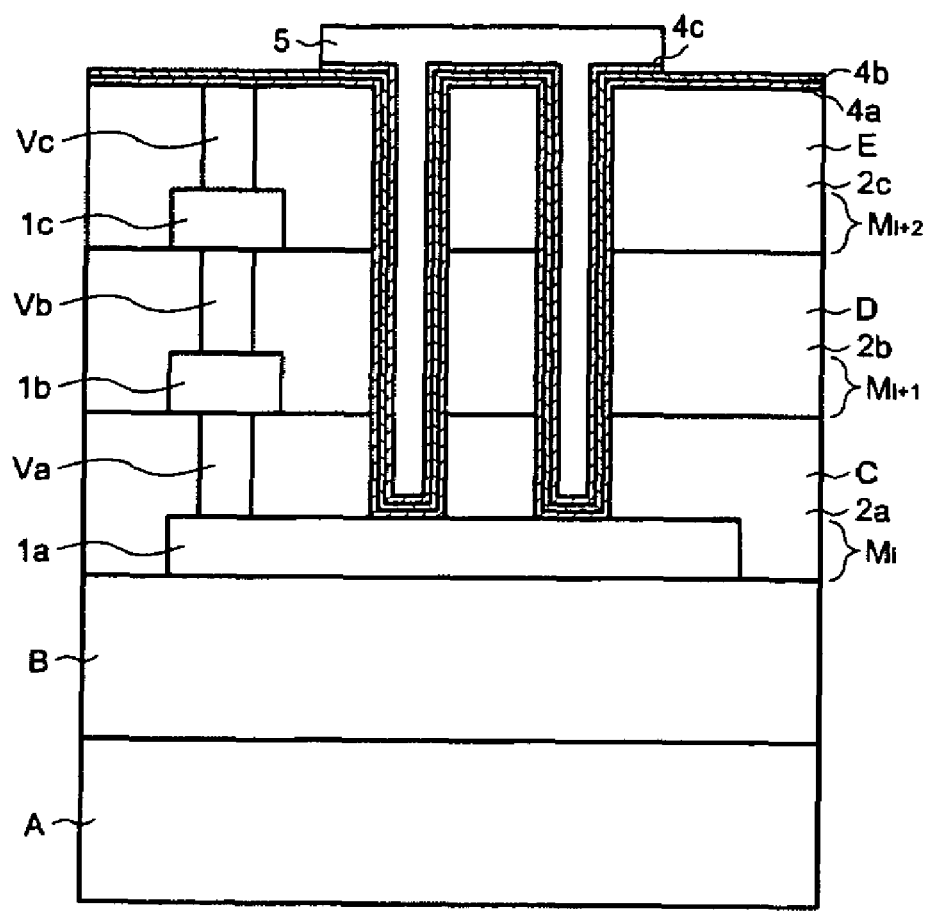

FIG. 5 illustrates the capacitor after etching the upper metal layers 5 and 4c so as to form the upper electrode of the capacitor.

Figure 6:
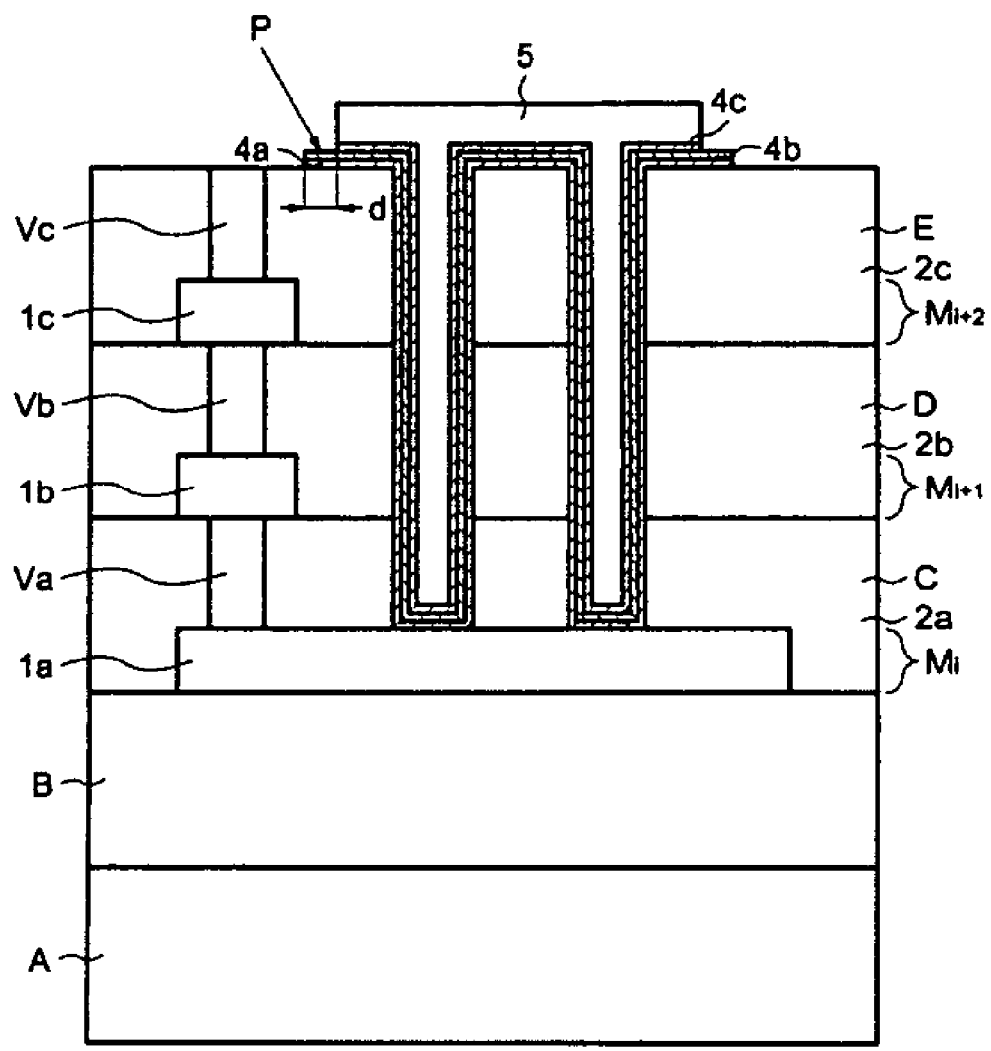

FIG. 6 illustrates the three-dimensional capacitor after simultaneous etching of the dielectric 4b and the lower electrode 4a. This etching is advantageously carried out so as to slightly offset the dielectric 4b and the underlying lower electrode 4a with respect to the metal layers 4c and 5 forming the upper electrode, constituting the offset part P. This avoids laterally short-circuiting the lower electrode and the upper electrode of the capacitor when etching, or producing current leaks between the two electrodes. The distance d between the end of the upper electrode 4c and 5 and the end of the stack of the dielectric 4b and the lower electrode 4a is, for example, 0.5 μm.

Figure 7:
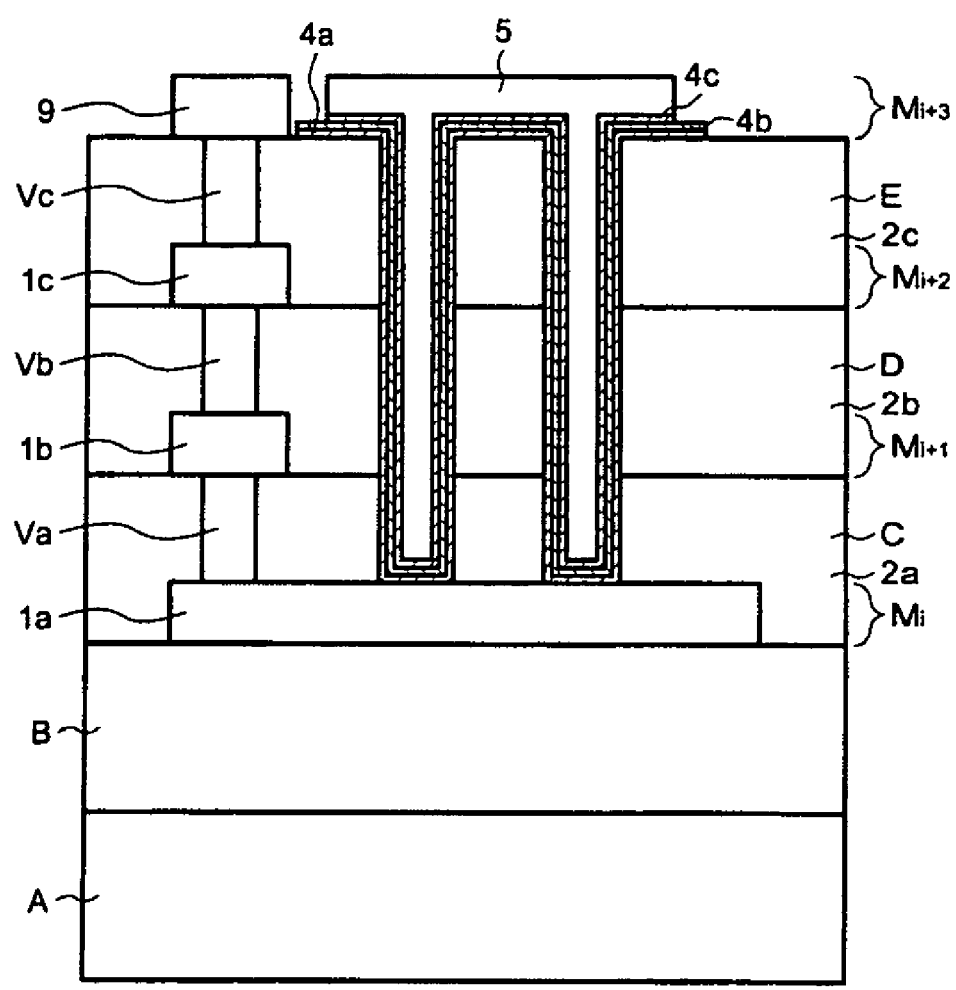

The metallization level $M_{i+3}$ is subsequently produced in a conventional way (FIG. 7) in order to form in particular the track 9 in contact with the via Vc.

Figure 8:
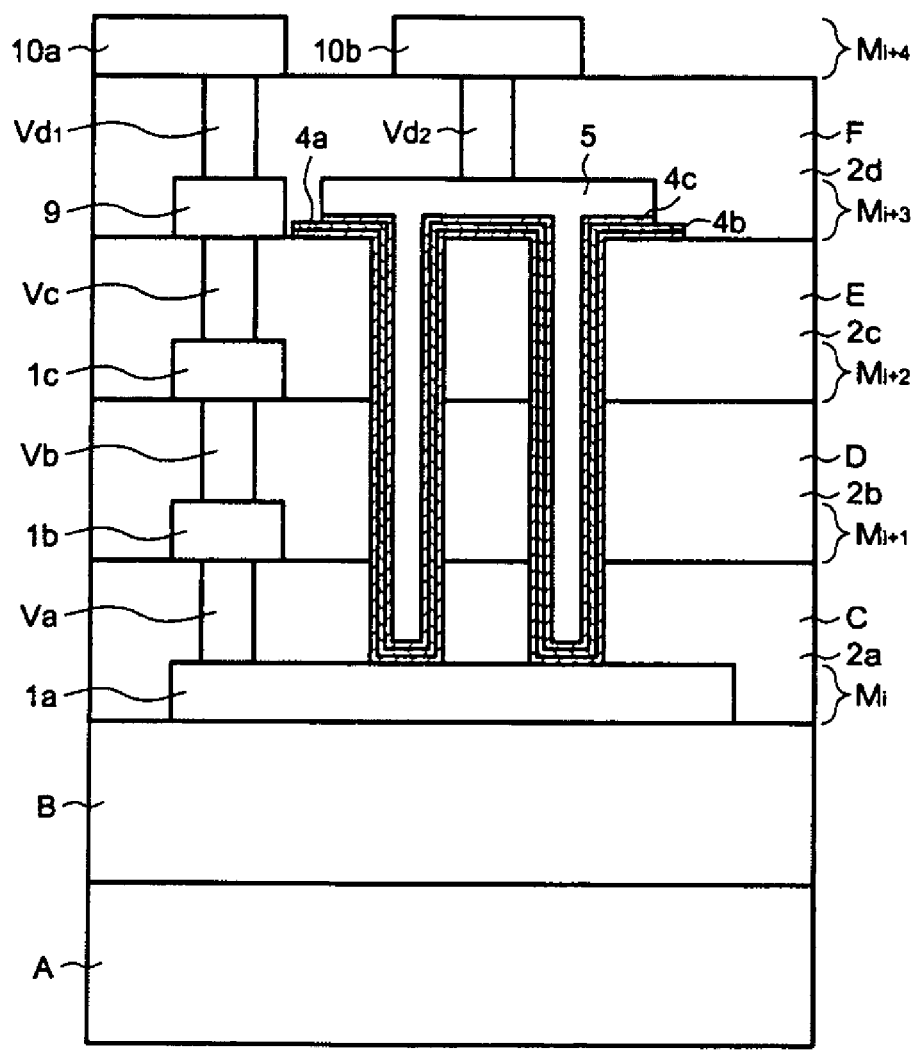

FIG. 8 illustrates the end of the method for producing the interconnection level F by depositing a dielectric 2d. A via Vd1 is formed in extension of the vias Vc, Vb, Va and the interconnection lines 1a, 1b, 1c and 9. A second via Vd2 is formed so as to come in contact with the metal layer 5 of the upper electrode of the capacitor. Interconnection lines 10a and 10b are then formed at the metal level $M_{i+4}$ on the vias Vd1 and Vd2.

Contact is made on the lower electrode 4a by the tracks 10a, 9, 1c, 1b, the vias Vd1, Vc, Vb, Va and the metal layer 1a. Contact is made on the upper electrode by the track 10b, the via Vd2 and the metal layer 5.

Figure 9:
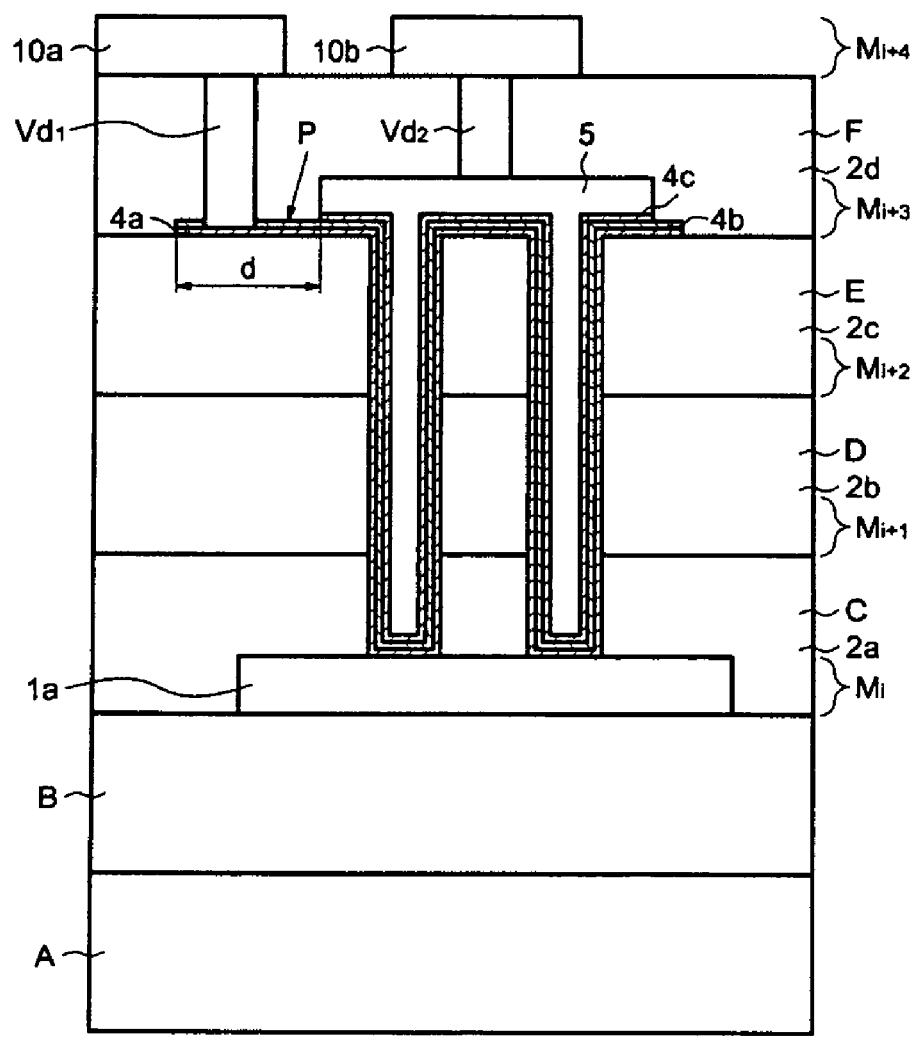
FIG. 9 illustrates another embodiment of the three-dimensional capacitor according to the invention.

In the embodiment of FIG. 9, contact is made on the lower electrode 4a directly hereon, rather than by means of the metal layer 1a. In this regard, the method for fabricating such a capacitor does not include production of the vias Va, Vb and Vc or the tracks 1b, 1c and 9. Simultaneous etching of the dielectric 4b and the layer 4a is carried out so as to obtain an offset part P having a length d sufficient to make it possible to produce the via Vd1 coming in contact with the offset part of the lower electrode 4a.

Whereas the layer 1a also had a function of making contact on the lower electrode in the embodiment of FIG. 8, the function of the metal layer 1a in the embodiment of FIG. 9 is to be a stop layer for etching the trenches and to short-circuit the lower electrode.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for the fabrication of an integrated circuit capacitor, comprising:

producing a metal layer embedded in a dielectric material;

etching the dielectric material;

stopping etching at the metal layer so as to form at least two capacitive trenches extending within the dielectric material;

depositing a layer of conductive material to form a lower electrode of the capacitor on a top surface of the dielectric material and on the sidewalls of the at least two trenches and in contact with the embedded metal layer;

depositing an insulating material layer above the dielectric material; and etching the insulating material layer to expose a contact to a top surface of the lower electrode layer of conductive material;

wherein the capacitor trenches extend over at least two interconnection levels of the integrated circuit and the embedded metal layer forms part of the metallization level of a lower interconnection level.

2. A method, comprising:

forming a metallization layer buried within an overlying dielectric material;

forming at least two trenches the dielectric material extending down to expose the buried metallization layer;

depositing a first conductive material layer to form a lower electrode of a capacitor on a top surface of the dielectric layer, the sides of the at least two trenches and the exposed buried metallization layer;

depositing a dielectric layer covering the first conductive material layer over the top surface of the dielectric layer and within at least the at least two trenches;

depositing a second conductive material layer to form an upper electrode of the capacitor covering the dielectric layer at the top surface and within at least the at least two trenches;

depositing an insulating material layer above the dielectric material;

etching the insulating material layer and the dielectric layer to expose a contact opening to a top surface of the lower electrode first conductive material layer;

wherein the capacitor extends over at least two interconnection levels of the integrated circuit, and the buried metallization layer forms part of the metallization level of a lower interconnection level; and forming an electrical terminal contact with the lower electrode through the contact opening in the insulating material layer which comprises an upper interconnection level lying above the two interconnection levels.

3. The method of claim 2 further comprising forming structure through the insulating material layer which comprises the upper interconnection level to electrically contact the second conductive material layer forming the upper electrode of the capacitor.

4. The method of claim 2 wherein depositing the first conductive material layer forming a lower electrode of the capacitor comprises depositing the first conductive material layer to bridge between the at least two trenches on the top surface of the dielectric material overlying the buried metallization layer.

5. An integrated circuit comprising at least one capacitor extending within a dielectric material, comprising:
  a metal layer embedded in the dielectric material;
  at least two capacitive trenches whose bottoms bear on the metal layer;
  a layer of deposited conductive material forming a lower electrode of the capacitor which lies on a top surface of the dielectric material and on the sidewalls of the trenches and is in contact with the metal layer;
  an insulating material layer above the dielectric material; and
  an opening etched in the insulating material layer to expose a contact to a top surface of the lower electrode layer of conductive material;
  wherein the capacitor trenches extend over at least two interconnection levels of the integrated circuit, and the embedded metal layer forms part of the metallization level of a lower interconnection level.

6. An integrated circuit, comprising:
  a buried metallization layer;
  dielectric material overlying the buried metallization layer;
  at least two trenches formed in the dielectric material extending down to expose the buried metallization layer;
  a first conductive material layer forming a lower electrode of a capacitor deposited on a top surface of the dielectric layer, on the sides of the at least two trenches and the exposed buried metallization layer;
  a dielectric layer covering the first conductive material layer over the top surface of the dielectric layer and within at least the at least two trenches;
  a second conductive material layer forming an upper electrode of the capacitor deposited over the dielectric layer at the top surface and covering the dielectric layer within at least the at least two trenches;
  an insulating material layer above the dielectric material;
  a contact opening etched in the insulating material layer and the dielectric layer to expose a top surface of the lower electrode first conductive material layer;
  wherein the capacitor extends over at least two interconnection levels of the integrated circuit, and the buried metallization layer forms part of the metallization level of a lower interconnection level; and
  a contact terminal formed in the contact opening directly in contact with the lower electrode, the insulating material layer forming an upper interconnection level lying above the two interconnection levels.

7. The integrated circuit of claim 6 further comprising means passing through the insulating material layer which comprises the upper interconnection level for electrically contacting the second conductive material layer forming the upper electrode of the capacitor.

8. The integrated circuit of claim 6 wherein the contact terminal comprises means for electrically contacting the first conductive material layer forming the lower electrode of a capacitor.

9. The integrated circuit of claim 6 wherein the first conductive material layer forming the lower electrode of a capacitor bridges between the at least two trenches on the top surface of the dielectric material overlying the buried metallization layer.

* * * * *